(12) United States Patent
Moriya

(10) Patent No.: US 7,648,581 B2
(45) Date of Patent: Jan. 19, 2010

(54) SUBSTRATE CLEANING METHOD, SUBSTRATE CLEANING APPARATUS, SUBSTRATE PROCESSING SYSTEM, SUBSTRATE CLEANING PROGRAM AND STORAGE MEDIUM

(75) Inventor: Tsuyoshi Moriya, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 642 days.

(21) Appl. No.: 11/274,117

(22) Filed: Nov. 16, 2005

(65) Prior Publication Data

US 2006/0102207 A1 May 18, 2006

Related U.S. Application Data

(60) Provisional application No. 60/635,615, filed on Dec. 14, 2004.

(30) Foreign Application Priority Data

Nov. 16, 2004 (JP) .................. 2004-332080

(51) Int. Cl.
*B08B 3/12* (2006.01)
*B08B 6/00* (2006.01)
*B08B 7/00* (2006.01)
*C25F 1/00* (2006.01)

(52) U.S. Cl. ................. 134/1; 134/1.1; 134/1.2; 134/1.3

(58) Field of Classification Search ............. None
See application file for complete search history.

(56) References Cited

U.S. PATENT DOCUMENTS

| 5,967,156 | A | * | 10/1999 | Rose et al. ............... 134/7 |
| 6,066,032 | A | * | 5/2000 | Borden et al. ............ 451/80 |
| 6,848,458 | B1 | * | 2/2005 | Shrinivasan et al. ...... 134/108 |
| 2004/0050405 | A1 | * | 3/2004 | Christenson et al. ...... 134/25.4 |
| 2005/0217706 | A1 | * | 10/2005 | Banerjee et al. ............ 134/26 |

\* cited by examiner

*Primary Examiner*—Duy-Vu N Deo
(74) *Attorney, Agent, or Firm*—Oblon, Spivak, McClelland, Maier & Neustadt, L.L.P.

(57) ABSTRACT

In a substrate cleaning method for cleaning a backside of a substrate on a surface of which a predetermined processing is performed, a two phase substance contacts the backside of the substrate, and a flow of the substance is generated near the backside of the substrate under a specified pressure. The two phase substance is a gas containing aerosol or a supercritical substance, and the specified pressure is higher than or equal to 133 Pa (1 Torr). Further, in the substrate cleaning method, a high-energy light may be irradiated on the backside of the substrate.

10 Claims, 9 Drawing Sheets

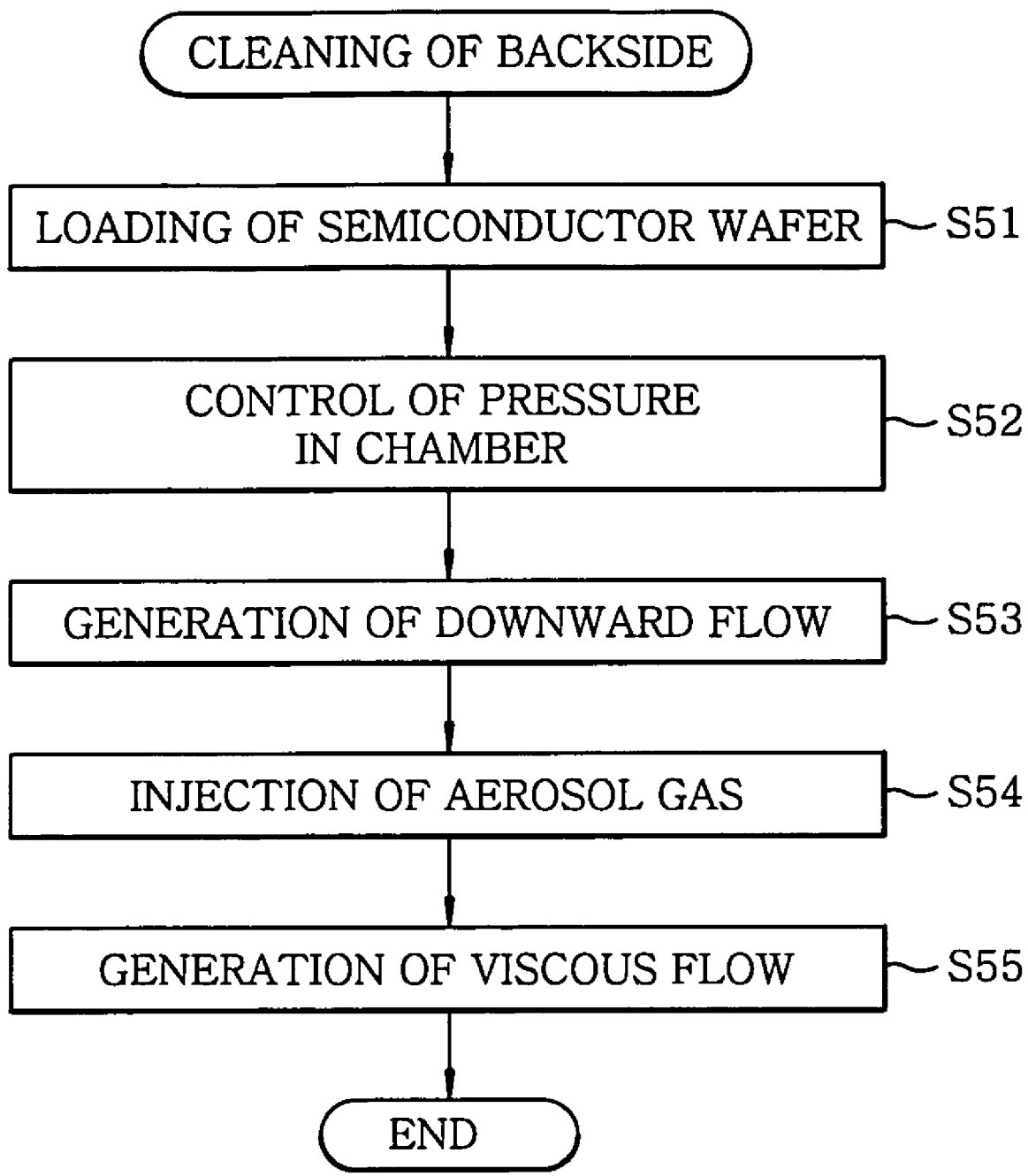

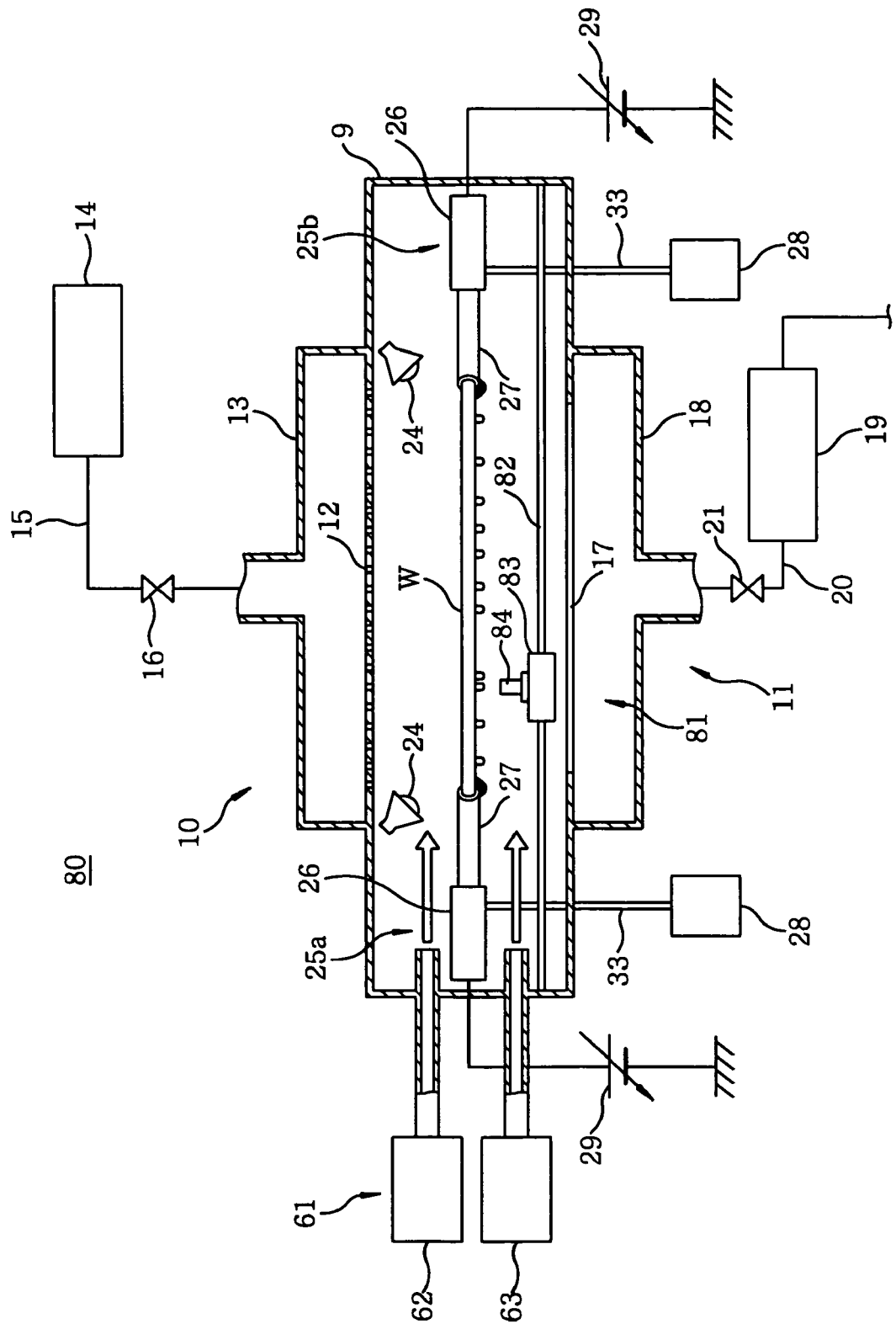

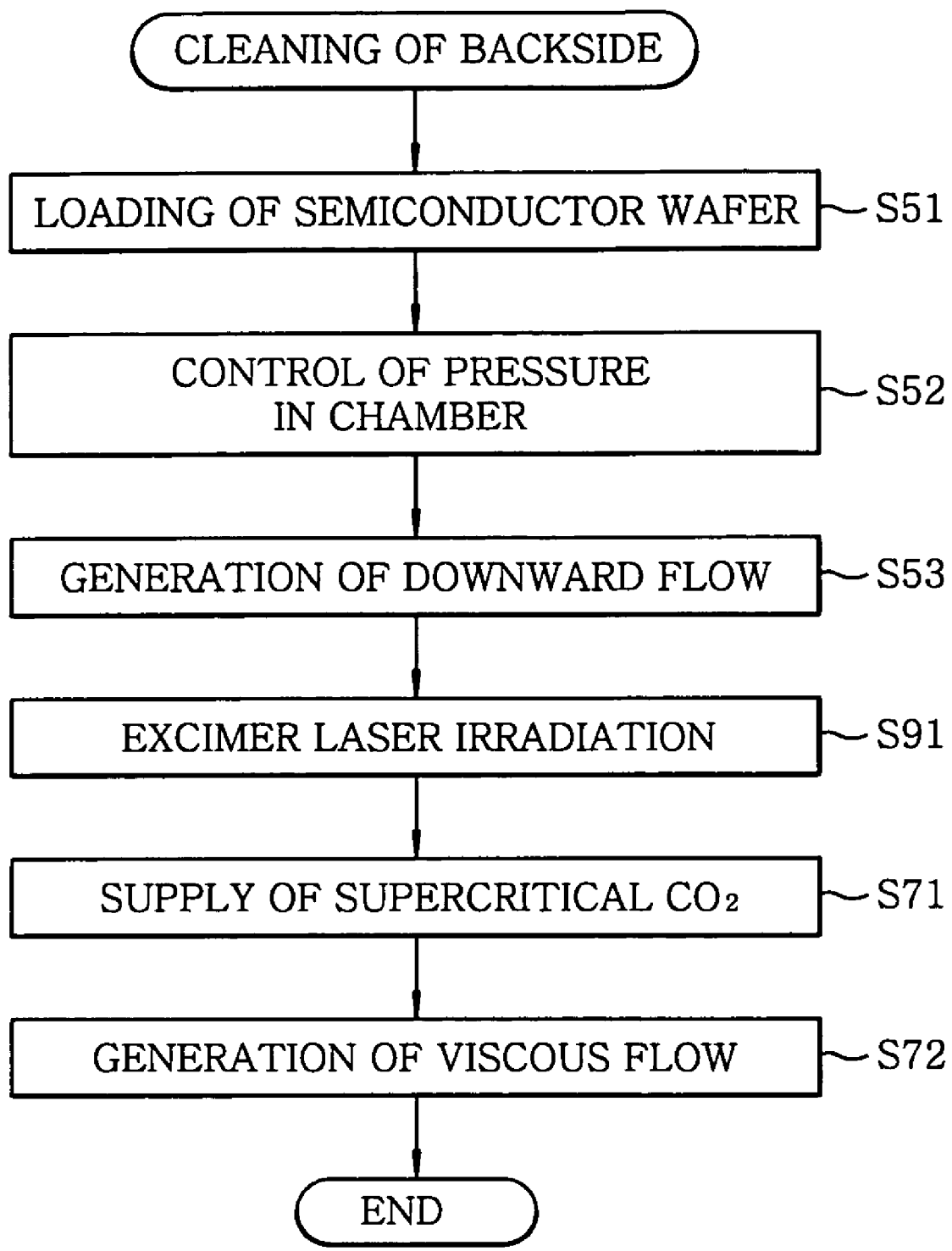

SUBSTRATE CLEANING METHOD, SUBSTRATE CLEANING APPARATUS, SUBSTRATE PROCESSING SYSTEM, SUBSTRATE CLEANING PROGRAM AND STORAGE MEDIUM

FIELD OF THE INVENTION

The present invention relates to a substrate cleaning method, a substrate cleaning apparatus, a substrate processing system, a substrate cleaning program and a storage medium; and, more particularly, to a substrate cleaning method for removing deposits adhered to a backside of a substrate.

BACKGROUND OF THE INVENTION

In general, in a substrate processing apparatus for performing a processing on a semiconductor wafer (hereinafter, referred to as "wafer") as a substrate, there are generated particles, e.g., fine fragments of aluminum, caused by a contact between the wafer and a mounting table for mounting thereon the wafer, reaction products, e.g., fluorocarbon-based polymer, caused by a reaction of a processing gas or the like. Such particles are adhered to the wafer and thus deteriorate quality of a semiconductor device formed on a surface of the wafer.

As for a method for removing particles adhered to a wafer, there has been known a wet cleaning method for cleaning a dry-etched wafer in a fluoric acid solution or pure water in a wet processing chamber. In accordance with such method, the particles adhered to the wafer can be removed during a dry etching process (see, e.g., U.S. Pat. No. 5,135,608).

However, in the aforementioned wet cleaning method, pure water or the like is ejected mostly toward a surface of the wafer. Therefore, particles adhered to a backside of the wafer, i.e., foreign substances adhered to an entire backside of the wafer or bevel polymer adhered to a peripheral portion of the backside of the wafer, cannot be removed.

The wafer is kept afloat by the particles adhered to the backside of the wafer while it is mounted on the mounting table, so that, during a lithography process for exposing a photoresist coated on the wafer surface, a distance between the wafer and an exposure device does not coincide with a focal length of the exposure device and, therefore, a mask pattern cannot be precisely reproduced on the wafer surface. Consequently, the quality of a semiconductor device formed on the corresponding wafer is deteriorated.

In case wafers undergone a predetermined plasma process are transferred in an airtight container such as a FOUP for holding a plurality of wafers in parallel, particles detached from a backside of a wafer held in an upper level in the FOUP may fall downward to be adhered to a surface of a wafer held in a lower level in the FOUP, thereby deteriorating the quality of a semiconductor device formed on the wafer held in the lower level in the FOUP.

In the aforementioned wet cleaning method, a flow of the pure water used for a wet cleaning is not controlled. Thus, even if the particles and/or the bevel polymer are removed from the backside of the wafer, they can be adhered again to a surface of a wafer which is undergoing a predetermined process, e.g., a drying treatment, at a vicinity of a wet cleaned wafer. Consequently, the quality of a semiconductor device formed on the wafer can be deteriorated.

SUMMARY OF THE INVENTION

It is, therefore, an object of the present invention to provide a substrate cleaning method, a substrate cleaning apparatus, a substrate processing system, a substrate cleaning program and a storage medium, which are capable of completely removing deposits adhered to a backside of a substrate and also preventing quality deterioration of a semiconductor device formed on the substrate.

In accordance with an aspect of the present invention, there is provided a substrate cleaning method for cleaning a backside of a substrate on a surface of which a predetermined processing is performed, the method including the steps of: contacting a two phase substance to the backside of the substrate; and generating a flow of the substance near the backside of the substrate under a specified pressure.

The specified pressure is preferably higher than or equal to 133 Pa (1 Torr).

The two phase substance may be a gas containing aerosol or a supercritical substance.

The supercritical substance contains an additive for dissolving deposits adhered to the substrate. Further, in the step of contacting the two phase substance to the backside of the substrate, a supercritical substance without containing the additive is made to contact the surface of the substrate and the supercritical substance containing the additive is made to contact the backside of the substrate.

In accordance with another aspect of the present invention, there is provided a substrate cleaning method for cleaning a backside of a substrate on a surface of which a predetermined processing is performed, the method including the steps of: irradiating a high-energy light on the backside of the substrate; and generating a flow of a substance near the backside of the substrate under a specified pressure.

The substance is preferably a two phase substance. Further, the two phase substance may be a gas containing aerosol or a supercritical substance.

In accordance with still another aspect of the present invention, there is provided a substrate cleaning apparatus for cleaning a backside of a substrate on a surface of which a predetermined processing is performed, the apparatus including: a unit for contacting a two phase substance to the backside of the substrate; and a unit for generating a flow of the substance near the backside of the substrate under a specified pressure.

In accordance with still another aspect of the present invention, there is provided a substrate cleaning apparatus for cleaning a backside of a substrate on a surface of which a predetermined processing is performed, the apparatus including: a unit for irradiating a high-energy light on the backside of the substrate; and a unit for generating a flow of a substance near the backside of the substrate under a specified pressure.

In accordance with still another aspect of the present invention, there is provided a substrate processing system having at least one substrate processing apparatus for performing a predetermined processing on a substrate, the substrate processing system including: a substrate cleaning apparatus for cleaning a backside of the substrate, wherein the substrate cleaning apparatus includes: a unit for contacting a two phase substance to the backside of the substrate; and a unit for generating a flow of the substance near the backside of the substrate under a specified pressure.

In accordance with still another aspect of the present invention, there is provided a substrate processing system having at least one substrate processing apparatus for performing a predetermined processing on a substrate, the substrate processing system including: a substrate cleaning apparatus for cleaning a backside of the substrate, wherein the substrate cleaning apparatus includes: a unit for irradiating a high-energy light on the backside of the substrate; and a unit for generating a flow of the substance near the backside of the substrate under a specified pressure.

In accordance with still another aspect of the present invention, there is provided a substrate cleaning program for executing in a computer a substrate cleaning method for cleaning a backside of a substrate on a surface of which a predetermined processing is performed, the substrate cleaning program including: a module for contacting a two phase substance to the backside of the substrate; and a module for generating a flow of the substance near the backside of the substrate under a specified pressure.

In accordance with still another aspect of the present invention, there is provided a substrate cleaning program for executing in a computer a substrate cleaning method for cleaning a backside of a substrate to a surface of which a predetermined processing is performed, the substrate cleaning program including: a module for irradiating a high-energy light on the backside of the substrate; and a module for generating a flow of a substance near the backside of the substrate under a specified pressure.

In accordance with still another aspect of the present invention, there is provided a computer readable storage medium for storing therein a program for executing a substrate cleaning method for cleaning a backside of a substrate on a surface of which a predetermined processing is performed, wherein the program includes: a module for contacting a two phase substance to the backside of the substrate; and a module for generating a flow of the substance near the backside of the substrate under a specified pressure.

In accordance with still another aspect of the present invention, there is provided a computer readable storage medium for storing therein a program for executing a substrate cleaning method for cleaning a backside of a substrate on a surface of which a predetermined processing is performed, wherein the program includes: a module for irradiating a high-energy light on the backside of the substrate; and a module for generating a flow of a substance near the backside of the substrate under a specified pressure.

In accordance with the present invention, a two phase substance contacts the backside of the substrate; and a flow of the substance is generated near the backside of the substrate under a specified pressure. Since the two phase substance has two characteristics for the respective phases, deposits attached on the backside of the substrate can be efficiently detached due to the synergy effects of the two characteristics. Further, since the flow of the substance generated under the specified pressure becomes a viscous flow, the deposits detached from the backside of the substrate can be efficiently removed from a vicinity of the backside of the substrate. In this way, the deposits detached on the backside of the substrate can be completely removed, thereby preventing a semiconductor device formed on the substrate from being deteriorated in quality.

In case the two phase substance is a gas containing aerosol, the aerosol collides with the deposits attached on the backside of the substrate, so that the adhesion of the deposits becomes weak to be detached, and the gas carries the detached deposits. In this way, it is possible to surely remove the deposits detached on the backside of the substrate.

In case the specified pressure is greater than or equal to 133 Pa (1 Torr), it is assured that the flow of the substance becomes a viscous flow. Accordingly, the deposits detached from the backside of the substrate can be surely removed from a vicinity of the backside of the substrate.

In case the two phase substance is a supercritical substance, since the supercritical substance has characteristics for both of the gas phase and the liquid phase, the substance penetrates to an interface between the backside of the substrate and the deposits due to the characteristics of the gas phase to deteriorate the adhesion of the deposits and captures the deposits whose adhesion is deteriorated with the help of the characteristics of its liquid phase. In this way, the deposits attached on the backside of the substrate can be surely detached.

In case the supercritical substance contains an additive for dissolving the deposits adhered to the substrate, the additive completely surrounds the deposits due to the characteristics of the supercritical substance. Accordingly, the deposits can be efficiently dissolved.

Further, in case a supercritical substance without containing the additive is made to contact the surface of the substrate and the supercritical substance containing the additive is made to contact the backside of the substrate, since the supercritical substance containing the dissolved deposits near the backside of the substrate is suppressed from flowing upwardly onto the surface of the substrate, thereby preventing the dissolved deposits from being attached again onto the surface of the substrate.

Moreover, in accordance with the present invention, a high-energy light is irradiated on the backside of the substrate; and a flow of a substance is generated near the backside of the substrate under a specified pressure. The substrate on which the high-energy light has been irradiated is expanded, so that the deposits attached on the backside of the substrate can be efficiently detached due to a difference between the thermal expansion rate of the backside of the substrate and those of the deposits. Further, since the flow of the substance generated under the specified pressure becomes a viscous flow, the detached deposits are efficiently removed from a vicinity of the backside of the substrate. In this way, the deposits attached on the backside of the substrate can be completely removed, thereby preventing deterioration in quality of a semiconductor device formed on the substrate.

BRIEF DESCRIPTION OF THE DRAWINGS

The above and other objects and features of the present invention will become apparent from the following description of preferred embodiments, given in conjunction with the accompanying drawings, in which:

FIG. 5 represents a flow chart of a wafer backside cleaning processing as a substrate cleaning method in accordance with the first preferred embodiment;

FIG. 8 depicts a cross sectional view illustrating a schematic composition of a cleaning chamber serving as a substrate processing apparatus in accordance with a third preferred embodiment of the present invention; and FIG. 9 shows a flow chart of a wafer backside cleaning processing as a substrate cleaning method in accordance with the third preferred embodiment.

DETAILED DESCRIPTION OF PREFERRED EMBODIMENTS

Hereinafter, preferred embodiments of the present invention will be described in detail with reference to the accompanying drawings.

First of all, a substrate cleaning apparatus and a substrate processing system in accordance with a first preferred embodiment of the present invention will be described.

Figure 1:
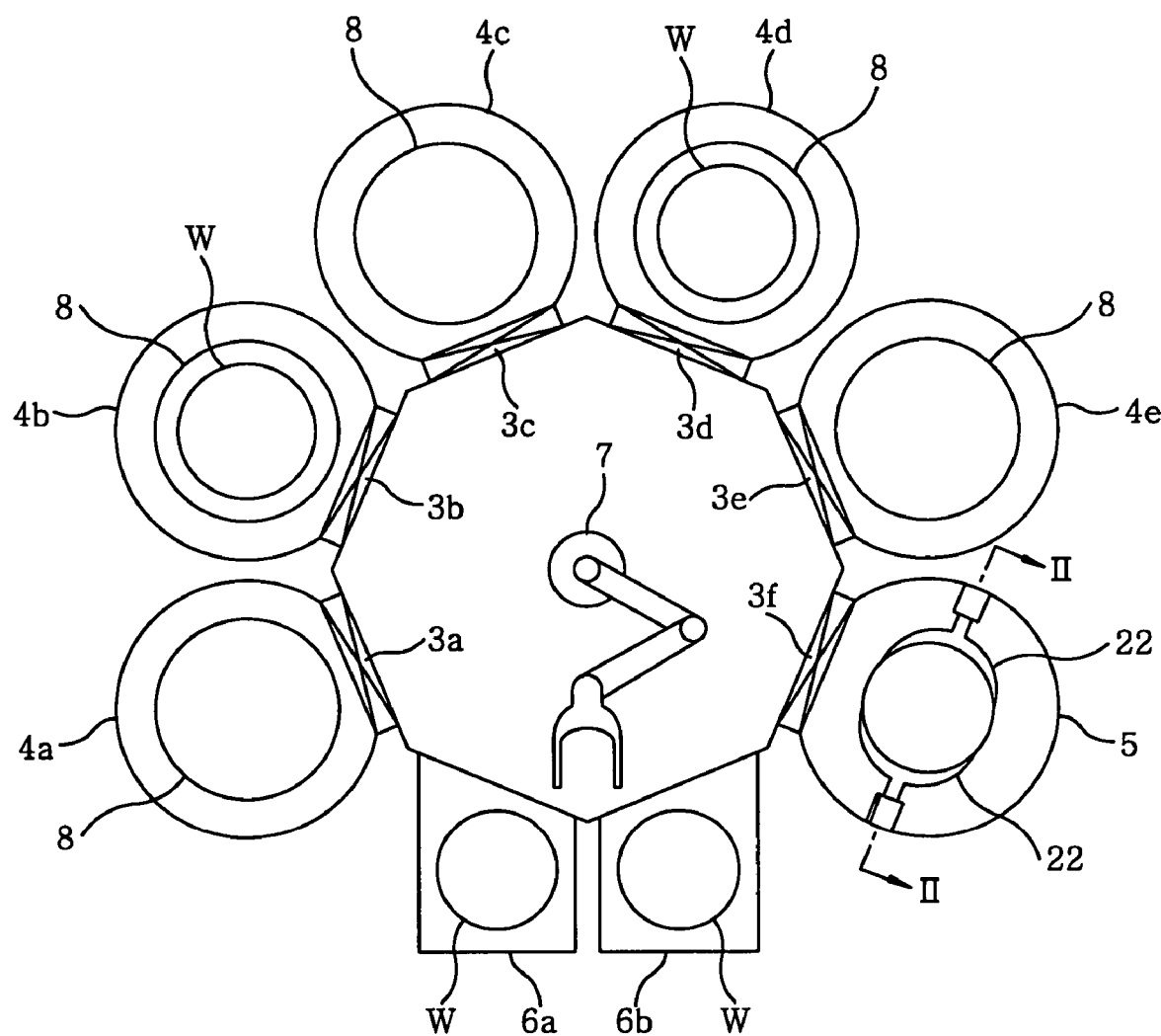
FIG. 1 is a top view schematically showing a substrate processing system in accordance with a first preferred embodiment of the present invention.

FIG. 1 is a top view schematically showing the substrate processing system in accordance with the first preferred embodiment.

Referring to FIG. 1, a cluster substrate processing system 1 includes: a polygonal transfer chamber 2; vacuum chambers 4a to 4e arranged along a periphery of the transfer chamber 2, the vacuum chambers serving as plasma processing chambers connected to sidewalls of the transfer chamber 2 via gate valves 3a to 3e; a single cleaning chamber (substrate cleaning apparatus) connected to a sidewall of the transfer chamber 2 via a gate valve 3f, same as the vacuum chambers 4a to 4e; and two cassette chambers 6a and 6b directly connected to sidewalls of the transfer chamber 2.

The transfer chamber 2 has a scalar transfer arm 7 capable of revolving, expanding and contracting. The transfer arm 7 can transfer a semiconductor wafer W to a desired position in the substrate processing system 1. Each of the vacuum chambers 4a to 4e has a mounting table 8 for mounting thereon the semiconductor wafer W, wherein a predetermined plasma processing, e.g., an etching processing, is performed on the semiconductor wafer W mounted on the mounting table 8.

The cleaning chamber 5 has a grip arm unit 22 for supporting the semiconductor wafer W, wherein a backside of the semiconductor wafer W (hereinafter, referred to as "wafer backside") supported by the grip arm unit 22 is cleaned. Each of the cassette chambers 6a, 6b has a cassette (not shown) for storing therein a plurality of unprocessed or processed semiconductor wafers W. The gate valves 3a to 3f that can be freely opened and closed make the respective vacuum chambers 4a to 4e and the cleaning chamber 5 communicate with the transfer chamber 2 and block the communication therebetween.

In case a plasma processing is performed on the semiconductor wafer W in the substrate processing system 1, the transfer arm 7 unloads an unprocessed semiconductor wafer W from a cassette of the cassette chamber 6a and then loads the semiconductor wafer W into one of the vacuum chambers 4a to 4e. In the same one of the vacuum chambers 4a to 4e, a plasma processing is performed on the semiconductor wafer W loaded therein and, then, the transfer arm 7 loads the plasma-processed semiconductor wafer W into the cleaning chamber 5. In the cleaning chamber 5, a backside of the loaded wafer is cleaned by using a wafer backside cleaning method to be described later. Next, the transfer arm 7 loads the semiconductor wafer W whose backside has been cleaned into a cassette of the cassette chamber 6b.

Figure 2:
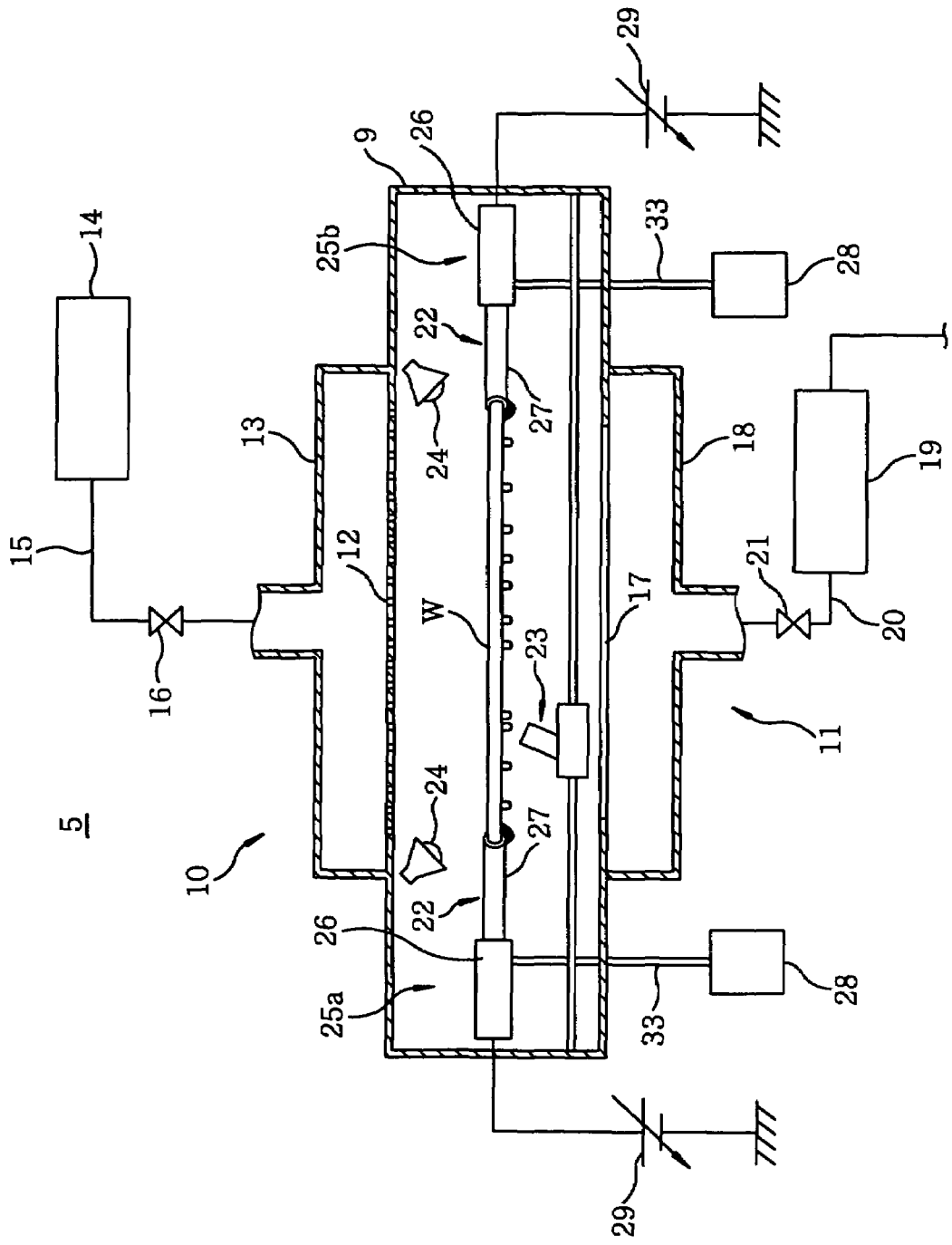
FIG. 2 describes a cross sectional view taken along line II-II in FIG. 1.

FIG. 2 provides a sectional view taken along line II-II in FIG. 1.

Referring to FIG. 2, the cleaning chamber 5 has an airtight cylindrical main chamber 9, a gas inlet 10 provided at an upper portion of the main chamber 9 and a gas outlet 11 provided at a lower portion of the main chamber 9.

The gas inlet 10 includes: a number of gas inlet holes 12 formed in a top surface of the main chamber 9; a buffer chamber 13 provided above the gas inlet holes 12; a gas supply unit 14 arranged to be separated from the main chamber 9; a gas inlet line 15 for connecting the buffer chamber 13 to the gas supply unit 14; and a valve 16 provided in the gas inlet line 15. In case a wafer backside needs to be cleaned, the valve 16 of the gas inlet 10 is opened and then $N_2$ gas or the like is supplied from the gas supply unit 14 into the main chamber 9 via the gas inlet line 15, the buffer chamber 13 and the gas inlet holes 12, thereby generating a downward flow in the main chamber 9.

The gas outlet 11 includes: a gas suction hole 17 formed in a bottom surface of the main chamber 9; a buffer chamber 18 provided below the gas suction hole 17; a gas exhaust pump 19 arranged to be separated from the main chamber 9; a gas discharge line 20 for connecting the buffer chamber 18 to the gas exhaust pump 19; and a valve 21 provided in the gas discharge line 20. In case the wafer backside needs to be cleaned, the valve 21 of the gas outlet 11 is opened and then the gas in the main chamber 9 is discharged through the gas suction hole 17, the buffer chamber 18 and the gas discharge line 20 by operating the gas exhaust pump 19. At this time, since the gas in the main chamber 9 is drawn downward, the downward flow generated by the gas inlet 10 in the main chamber 9 is further facilitated.

The main chamber 9 has the grip arm unit 22; an aerosol injection unit 23 provided under the semiconductor wafer W supported by the grip arm unit 22; and two heating lamps 24 provided above the supported semiconductor wafer W.

Figure 3A:
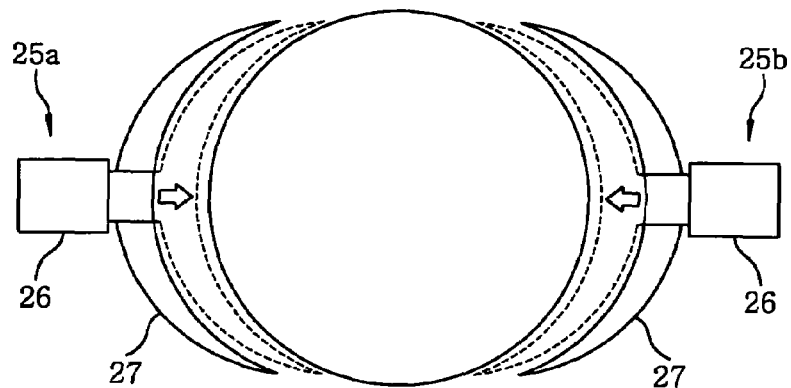
FIGS. 3A and 3B are a top view and a side view schematically showing a grip arm of FIG. 2, respectively.
Figure 3B:
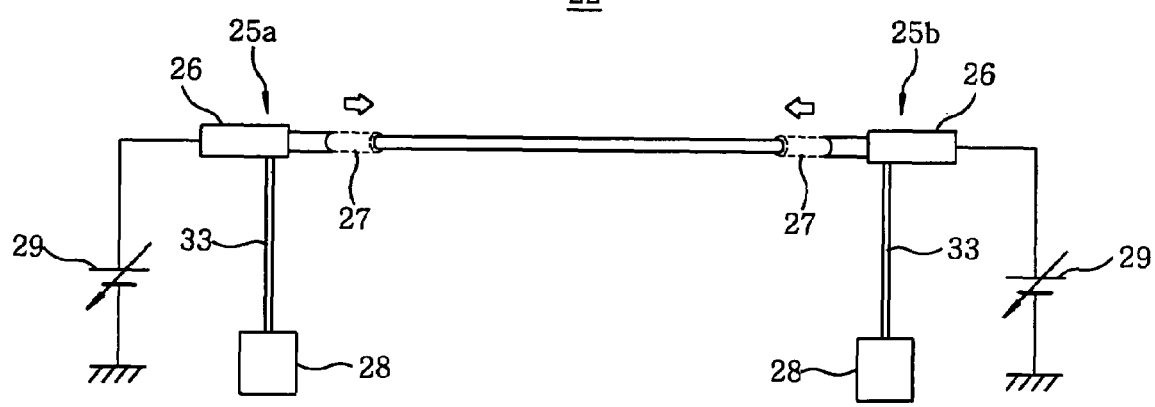

FIGS. 3A and 3B are a top view and a side view schematically showing the grip arm unit in FIG. 2, respectively.

Referring to FIGS. 3A and 3B, the grip arm unit 22 has a pair of support portions 25a and 25b for supporting a periphery of a wafer. Each of the support portions 25a and 25b includes: an arm base portion 26; an arm 27 stretchable from the arm base portion 26; an ultrasonic vibrator 28 connected to the arm base portion 26 via a vibration transmitting rod 33; and a DC power supply 29 connected to the arm base portion 26. The arm 27 is a plate member having a crescent shape as viewed from above. A portion of the arm 27 facing the semiconductor wafer W (hereinafter, referred to as "wafer facing portion") has a curvature coinciding with that of a periphery of the semiconductor wafer W.

In case the plasma processed semiconductor wafer W is loaded into the main chamber 9 by the transfer arm 7, the arms 27 of the respective support portions 25a and 25b of the grip arm unit 22 are protruded from the arm base portions 26 inwardly as indicated by the arrows in FIGS. 3A and 3B to allow the wafer facing portions thereof to contact with a periphery of the semiconductor wafer W, thereby supporting the semiconductor wafer W. At this time, since only the periphery of the semiconductor wafer W is contacted with the arms 27, a surface and a backside of the semiconductor wafer W are exposed.

Moreover, the ultrasonic vibrator 28 generates ultrasonic vibrations that are, in turn, transmitted to the semiconductor wafer W via the arm base portions 26 and the arms 27. The DC power supplies 29 apply respective voltages to the semiconductor wafer W via the arm base portions 26 and the arms 27.

Each of the heating lamps 24 irradiates heat rays on a top surface of the semiconductor wafer W supported by the grip arm unit 22 to thereby increase a temperature of the semiconductor wafer W.

Figure 4A:
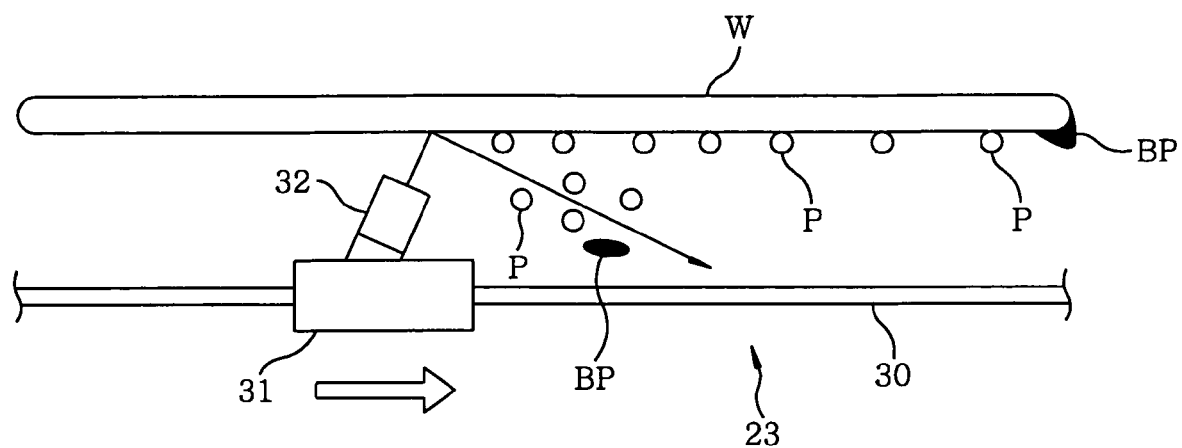
FIG. 4A presents a side view schematically showing an aerosol injection unit of FIG. 2.
Figure 4B:
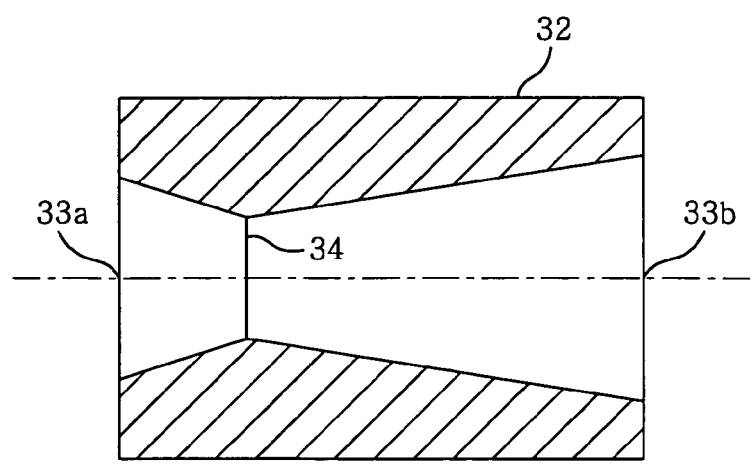
FIG. 4B is a sectional view of a Laval nozzle in the aerosol injection unit.

FIG. 4A is a side view schematically showing an aerosol injection unit of FIG. 2, and FIG. 4B is a sectional view of a Laval nozzle in the aerosol injection unit.

Referring to FIGS. 4A and 4B, the aerosol injection unit 23 includes: a guide rail 30 disposed in parallel with the semiconductor wafer W supported by the grip arm unit 22; a nozzle base portion 31 moving along the guide rail 30; a Laval nozzle 32 (having a converging front portion of a smaller diameter and a diverging rear portion of a larger diameter) provided at an upper portion of the nozzle base portion 31 while pointing a wafer backside at a predetermined angle of elevation.

The Laval nozzle 32 is a circular pipe member made of metal, e.g., aluminum, wherein an inner space of the pipe serves as a gas channel. Further, an inner diameter of the Laval nozzle 32 varies from an upstream end (left end in FIG. 4B) 33a through which gas is introduced to a downstream end (right end in FIG. 4B) 33b. Specifically, the inner diameter is gradually reduced from the upstream end 33a and then gradually increased from a location apart from the upstream end 33a by a predetermined distance to the downstream end 33b. In other words, the gas channel of the Laval nozzle 32 has a throttle portion 34 therein. In this embodiment, hereinafter, a portion ranging from the upstream end 33a to the throttle portion 34 is referred to as a converging portion, while a portion ranging from the throttle 34 to the downstream end 33b is referred to as a diverging portion.

The Laval nozzle 32 can increase a flow speed of the gas introduced therein through the upstream end 33a by way of properly setting inner diameters of the upstream end 33a, the throttle portion 34 and the downstream end 33b, lengths of the converging portion and the diverging portion and the like so that the gas can be ejected at a supersonic speed through the downstream end 33b. In this embodiment, dimensions of the Laval nozzle 32 are set to increase the flow velocity of the gas in the diverging portion to a supersonic speed.

The surface of a shock wave generated at a time when the flow velocity breaks the sound barrier in the diverging portion stagnates and, thus, a stationary shock wave is generated. Accordingly, a pressure gradient from a front portion to a rear portion of the Laval nozzle 32, i.e., from the upstream end 33a to the downstream end 33b, becomes discontinuous. At this time, by making a pressure at the upstream end 33a greater than a pressure at the downstream end 33b, i.e., a pressure in the main chamber 9, the flow speed of the gas can easily reach a supersonic speed in the Laval nozzle 32. In this embodiment, the pressure in the main chamber 9 is preferably set to be a few kPa (several tens of Torr) and the pressure at the upstream end 33a is preferably set to be an atmospheric pressure (100 kPa (760 Torr)).

When the gas in the diverging portion flows at a supersonic speed, the flow of the gas becomes an expansion flow. Further, as the flow speed increases, by an adiabatic expansion, a temperature of the gas is decreased. Accordingly, the temperature of the gas ejected from the Laval nozzle 32 sharply decreases below a solidification point of the gas. At this time, fine particles of solidified gas (aerosol) are generated in the gas flow. The gas ejected from the Laval nozzle 32 contains solid particles (aerosol) and thus has two phases.

In case the wafer backside needs to be cleaned, the Laval nozzle 32 ejects gas containing aerosol (hereinafter, referred to as "aerosol gas"). However, as described above, the Laval nozzle 32 points the wafer backside and, thus, the gas is made to collide with the wafer backside. At this time, if the aerosol contained in the gas collides with particles P adhered to the entire backside of the wafer or bevel polymer BP adhered to a peripheral portion of the backside, respective amounts of kinetic energies are imparted to the particles P and the bevel polymer BP such that they will be detached from the wafer backside. Further, the aerosol, which has imparted the kinetic energies to the particles P, gains a thermal energy from the semiconductor wafer W or from the atmosphere of the semiconductor wafer W to be vaporized.

The gas vaporized from the aerosol or the gas containing the aerosol collides against the wafer backside, thereby generating a gas flow toward the peripheral portion of the semiconductor wafer W. The particles P and the like detached from the wafer backside are transferred by the gas flow from the wafer backside to the gas outlet 11 to be discharged from the main chamber 9 through the gas outlet 11.

Further, in case the wafer backside is cleaned, the nozzle base portion 31 moves along the guide rail 30 in the direction as indicated by the arrow in FIG. 4A. While the nozzle base portion 31 is moving, the Laval nozzle 32 ejects the aerosol gas toward the wafer backside. Therefore, the aerosol injection unit 23 can eject the aerosol gas to the entire backside of the wafer, so that the particles P and the like can be removed from the entire backside of the wafer.

As described above, since the aerosol injection unit 23 is provided under the semiconductor wafer W, the aerosol gas collides against the wafer backside from below. Accordingly, the particles P and the like detached from the wafer backside can be effectively carried downward, i.e., toward the gas outlet 11, by gravity.

Besides, $N_2$ gas is introduced through the gas inlet 10 and, then, a downward flow of the $N_2$ gas is generated in the main chamber 9. Accordingly, it is possible to prevent the detached particles P and the like from moving upwardly in the main chamber 9 to be adhered to a surface of the semiconductor wafer W (hereinafter, referred to as also "wafer surface").

When the wafer backside needs to be cleaned, it is preferable to set the pressure in the main chamber 9 to be higher than or equal to 133 Pa (1 Torr). If the pressure in the main chamber 9 is higher than or equal to 133 Pa, a gas flow generated near the wafer backside, e.g., a gas flow of the gas vaporized from the aerosol and the aforementioned downward flow, becomes a viscous flow. As a result, since a viscosity of the gas becomes greater, the particles P and the like detached from the wafer backside can be effectively removed by the viscous gas flow from a vicinity of the wafer backside.

The gas ejected from the Laval nozzle 32 has to be one of the gases that do not explode when there occurs a sudden pressure change. Therefore, there may be used a rare gas such as He, Ne, Ar, Kr, Xe, Rn, or any gas selected from $N_2$, $CO_2$, $O_2$, $F_2$, $Cl_2$, $Br_2$ and the like.

There has been described so far a case where particles P and the like are removed from the wafer backside by using the aerosol injection unit 23. However, in order to facilitate the removal of the particles P from the wafer backside, there are other components which work in the cleaning chamber 5, as will be described hereinafter.

First of all, the ultrasonic vibrators 28 generate ultrasonic vibrations, which are in turn transmitted to the semiconductor wafer W via the arm base portions 26 and the arms 27. When the ultrasonic vibrations are transmitted to the semiconductor wafer W, an adhesive strength of the particles P and the like to the semiconductor wafer W deteriorates, thereby facilitating the removal of the particles P and the like therefrom.

Moreover, the DC power supplies 29 apply respective voltages to the semiconductor wafer W via the arm base portions 26 and the arms 27. At this time, with the voltages applied to the semiconductor wafer W, an electric field is generated in the main chamber 9 and, therefore, an electromagnetic stress acts on the wafer backside. The electromagnetic stress, which is a repulsive force for separating adjacent substances from each other when an electric field is generated around the substances having different dielectric constants, weakens the adhesive strength of the particles P adhered to the wafer backside, thereby facilitating the removal of the particles P and the like therefrom.

Here, it is preferable for the DC power supplies 29 to alternately apply voltages having different polarities to the semiconductor wafer W in the cleaning chamber 5. When a mode for applying a voltage to the semiconductor wafer W is switched to a mode for stopping the voltage application or vice versa, the electromagnetic stress effectively acts on the wafer backside. The effective electromagnetic stress acts on the wafer backside repetitively, thereby further facilitating the removal of the particles P and the like adhered to the wafer backside. Further, since the voltages having different polarities are alternately applied to the semiconductor wafer W, the semiconductor wafer W can be prevented from being electrically charged.

Further, the voltage applied to the semiconductor wafer W by each of the DC power supplies 29 is varied depending on the pressure in the main chamber 9. However, the voltage is preferably several hundreds V, for example, that can prevent a charge-up damage from being caused on the semiconductor wafer W.

In addition, each of the heating lamps 24 irradiates heat rays on the top surface of the semiconductor wafer W supported by the grip arm unit 22, thereby increasing a temperature of the semiconductor wafer W. At this time, a temperature gradient is formed between the semiconductor wafer W and a wall surface of the main chamber 9 and, further, the particles P and the like are moved by a thermophoretic force applied thereto from the semiconductor wafer W (higher temperature portion) toward the wall surface (lower temperature portion). Accordingly, the adhesive strength of the particles P adhered to the wafer backside becomes weak, which facilitates the removal of the particles P and the like.

An operation of each component in the cleaning chamber 5 is controlled by a personal computer (not shown) included in the substrate processing system 1.

Hereinafter, a substrate cleaning method in accordance with this embodiment will be described.

FIG. 5 represents a flow chart of a wafer backside cleaning processing as the substrate cleaning method in accordance with this embodiment.

Referring to FIG. 5, first of all, the transfer arm 7 loads a semiconductor wafer W, which has undergone a plasma processing in one of the vacuum chambers 4a to 4e, into the main chamber 9 of the cleaning chamber 5 (step S51) and, then, the grip arm unit 22 supports the loaded semiconductor wafer W.

Next, the gas outlet 11 controls a pressure in the main chamber 9 to a few kPa by discharging air in the main chamber 9 (step S52). Thereafter, the gas inlet 10 supplies $N_2$ gas into the main chamber 9 to generate a downward flow in the main chamber 9 (step S53).

In the aerosol injection unit 23, the nozzle base portion 31 starts to move along the guide rail 30 and, further, the Laval nozzle 32 ejects the aerosol gas toward the wafer backside (step of contacting two phase substance) (step S54). At this time, the aerosol collides with particles P and the like adhered to the wafer backside, thereby detaching the particles P and the like therefrom. Moreover, the DC power supplies 29 alternately apply voltages to the semiconductor wafer W, the ultrasonic vibrator 28 transmits ultrasonic vibrations to the semiconductor wafer W and each of the heating lamps 24 increases a temperature of the semiconductor wafer W, facilitating the detachment of the particles P and the like.

Next, the gas vaporized from the aerosol and the gas containing aerosol collide against the wafer backside, thereby generating a gas flow toward the periphery of the semiconductor wafer W. At this time, since the pressure in the main chamber 9 is controlled to a few kPa, the gas flow becomes a gas viscous flow (step of generating a flow near the wafer backside) (step S55). The particles P and the like detached from the wafer backside are carried and removed by the gas viscous flow from the vicinity of the wafer backside.

While the nozzle base portion 31 is moving, the aerosol injection unit 23 continuously performs steps S54 and S55, thereby scanning the wafer backside with a flow of the aerosol gas. Further, when the movement of the nozzle base portion 31 is completed, the processing is also completed.

In accordance with the substrate cleaning apparatus, the substrate processing system and the substrate cleaning method in accordance with this embodiment, the aerosol gas contacts with the wafer backside and, further, a flow of the gas vaporized from the aerosol and a flow of the gas containing aerosol are generated near the wafer backside under a pressure of a few kPa in the main chamber 9. The aerosol gas has characteristics of two phases (gas phase and solid phase), so that the particles P and the like adhered to the wafer backside can be effectively removed by a synergy effect of such characteristics therefrom. Specifically, the aerosol collides with the particles P and the like on the wafer backside, thereby imparting kinetic energies to the particles P and the like to detach them from the wafer backside. Further, the flows of the gas vaporized from the aerosol and the gas containing aerosol carry the detached particles P and the like. Moreover, the gas flow becomes a viscous flow under the pressure of a few kPa, so that the particles P and the like detached from the wafer backside can be effectively removed from the vicinity of the wafer backside. As a result, it is possible to completely remove the particles P and the like adhered to the wafer backside and further to prevent a semiconductor device formed on the semiconductor wafer W from being deteriorated in its quality.

In the Laval nozzle 32 of this embodiment, the stationary shock wave is generated in the diverging portion. However, by controlling pressures at the upstream end 33a and the downstream end 33b, the stationary shock wave may be generated at an outside of the Laval nozzle 32.

To be specific, the pressure at the upstream end 33a is set to be higher than an atmospheric pressure while the pressure at the downstream end 33b is set to be lower than the pressure in the main chamber 9. At this time, the aerosol gas ejected from the Laval nozzle 32 is over-expanded and, accordingly, the stationary shock wave is generated at the outside of the Laval nozzle 32. Further, it is preferable to generate the stationary shock wave on the wafer backside. Consequently, vibrations of the stationary shock wave are transferred to the semiconductor wafer W. Due to the vibrations, the adhesive strength of the particles P and the like deteriorates, so that the detachment of the particles P and the like is facilitated.

In this embodiment, the semiconductor wafer W is supported by the grip arm unit 22 and the wafer backside is scanned by the aerosol gas ejected from the nozzle base portion 31 of the moving aerosol injection unit 23. However, by moving the semiconductor wafer W together with the grip arm unit 22 while the nozzle base portion 31 is fixed, the wafer backside can be scanned by the aerosol gas.

Hereinafter, a substrate cleaning apparatus in accordance with a second preferred embodiment of the present invention will be described.

A composition and an operation of the second preferred embodiment are basically same as those of the first preferred embodiment except that the wafer backside is cleaned by using a supercritical substance instead of the aerosol gas. Therefore, redundant explanations will be omitted, and only differences in composition and operation will be described hereinafter.

Figure 6:
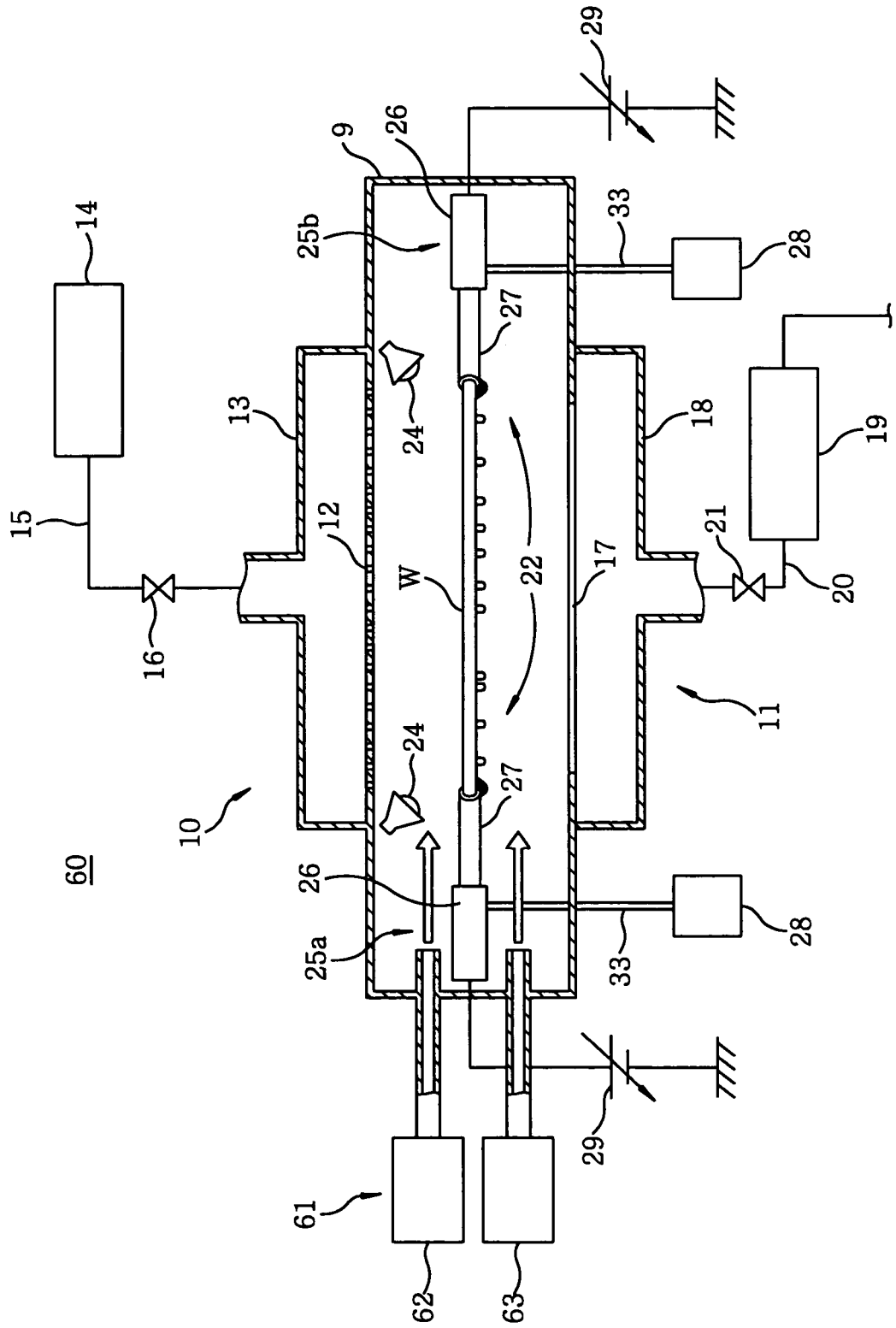
FIG. 6 provides a cross sectional view showing a schematic composition of a cleaning chamber serving as a substrate processing apparatus in accordance with a second preferred embodiment of the present invention.

FIG. 6 provides a cross sectional view schematically showing a cleaning chamber serving as a substrate processing apparatus in accordance with the second preferred embodiment.

Referring to FIG. 6, a cleaning chamber 60 includes a main chamber 9, a gas inlet 10 and a gas outlet 11. The main chamber 9 has a grip arm unit 22, a supercritical fluid supply unit 61 for supplying supercritical $CO_2$ to be described later to a surface and a backside of a semiconductor wafer W supported by the grip arm unit 22, two heating lamps 24 and a heater (not shown) for heating an atmosphere in the main chamber 9.

The supercritical fluid supply unit 61 includes: an upper processing fluid supply source 62 for supplying supercritical $CO_2$ toward an upper side above the top surface of the wafer supported by the grip arm unit 22 in a direction as indicated by the upper arrow in FIG. 6; and a lower processing fluid supply source 63 for supplying supercritical $CO_2$ toward a lower side below the backside of the wafer backside in a direction as indicated by the lower arrow in FIG. 6.

When a gaseous or liquid substance is present under a high-temperature and high-pressure condition beyond a critical point (gas and liquid can coexist at a temperature and a pressure of the critical point), densities of the gas and the liquid become identical to each other to make two phases (gas phase and liquid phase) undistinguishable, so that a boundary between gas and liquid is eliminated. The supercritical state indicates a state where a boundary between gas and liquid is absent as described above. Since a supercritical substance has characteristics of two phases, a fluid made of the supercritical substance (hereinafter, referred to as "supercritical fluid") penetrates into a fine recess of a semiconductor device formed on the wafer surface due to the characteristics of the gas phase and then captures and carries particles and the like existing in the fine recess due to the characteristics of the liquid phase. Such substances forming the supercritical fluid include $H_2O$, $CO_2$, $NH_3$, $CH_4$, $C_3H_8$, $CH_3OH$, $C_2H_5OH$ and the like. For example, $CO_2$ reaches the supercritical state under the conditions of 31.1° C. and 7.37 MPa.

In the cleaning chamber 60, in order to maintain a supercritical state of the supercritical fluid supplied from the supercritical fluid supply unit 61, a pressure in the main chamber 9 is maintained at a high pressure by using the gas outlet 11 and, further, the atmosphere in the main chamber 9 is maintained at a high temperature by using the heater. Specifically, in case the supercritical fluid is formed of $CO_2$, the atmosphere temperature in the main chamber 9 is maintained at 35° C. to 50° C. Further, the pressure in the main chamber 9 is maintained at about 10 MPa.

The upper processing fluid supply source 62 and the lower processing fluid supply source 63 supply same kind of supercritical fluid. However, the supercritical fluid supplied from the lower processing fluid supply source 63 (hereinafter, referred to as "lower supercritical fluid") contains various organic solvents as a compatible solvent, and a fluoride, e.g., HF, a chelate such as a water-soluble sequestering agent or the like as an additive. The compatible solvent and the additive contained in the lower supercritical fluid dissolve and remove the particles P and the like on the wafer backside. At this time, due to the gas-phase characteristics of the supercritical fluid, the compatible solvent and the additive completely surround and dissolve the particles P on the wafer backside. As a result, the particles P and the like can be efficiently dissolved. Further, the lower supercritical fluid can carry the dissolved particles P and the like due to the liquid-phase characteristics thereof. In the cleaning chamber 60, the pressure in the main chamber 9 is maintained at a high pressure and, therefore, a flow of the lower supercritical fluid forms a viscous flow. As a result, the dissolved particles P and the like can be removed while being carried from a vicinity of the wafer backside.

The compatible solvent and the additive contained in the lower supercritical fluid are chosen depending on materials of particles and bevel polymer to be dissolved. For example, in case the particles are mainly formed of a heavy metal, e.g., Al, to the lower supercritical fluid formed of $CO_2$, $C_2H_5OH$ of 10 to 20 wt % for $CO_2$ is added as a compatible solvent and $C_6H_8O_7$ of 0.05 to 1.0 mol % for $CO_2$ is added as an additive. In the lower supercritical fluid, molecules in the additive and the organic solvent form metal complexes around Al atoms and, then, such generated metal complexes dissolve in the lower supercritical fluid. Accordingly, particles formed of a heavy metal are removed from the wafer backside.

Further, for example, in case the bevel polymer is mainly formed of etching residues, i.e., a reaction compound generated from an etching gas, to the lower supercritical fluid formed of $CO_2$, $C_2H_5OH$ of 10 to 20 wt % for $CO_2$ is added as a compatible solvent and a tertiary amine compound, e.g., trimethylmethane or the like, of 0.1 or more mol % for $CO_2$ is added as an additive. In the lower supercritical fluid, the tertiary amine compound mainly dissolves and removes the bevel polymer from the wafer backside.

In this case, the lower supercritical fluid containing the compatible solvent and the additive does not etch the wafer backside chemically or physically, so that the semiconductor wafer W can be free from damages.

Meanwhile, unlike the lower supercritical fluid, a supercritical fluid supplied from the upper processing fluid supply source 62 (hereinafter, referred to as "upper supercritical fluid") does not contain an additive and a compatible solvent. Further, a supply pressure of the upper supercritical fluid is set to be higher than that of the lower supercritical fluid. Accordingly, the lower supercritical fluid containing the dissolved particles P and the like is prevented from flowing upwardly onto the wafer surface. As a result, it is possible to prevent the removed particles P and the like from being adhered to the wafer surface to deteriorate a quality of the semiconductor device.

When the wafer backside is cleaned in the cleaning chamber 60, particles P and the like are removed from the wafer backside by supplying a supercritical fluid from the supercritical fluid supply unit 61 into the main chamber 9. In addition, as in the substrate cleaning apparatus in accordance with the first preferred embodiment of the present invention, an ultrasonic vibrator 28 generates ultrasonic vibrations; DC power supplies 29 alternately apply respective voltages to the semiconductor wafer W; and each of heating lamps 24 increases a temperature of the semiconductor wafer W, thereby facilitating removal of the particles P and the like from the wafer backside. Moreover, the gas outlet 11 generates a downward flow in the main chamber 9. Consequently, the particles P and the like dissolved in the lower supercritical fluid can be prevented from flowing upwardly onto the wafer surface to be adhered thereto.

Hereinafter, a substrate cleaning method in accordance with the second preferred embodiment will be described.

Figure 7:
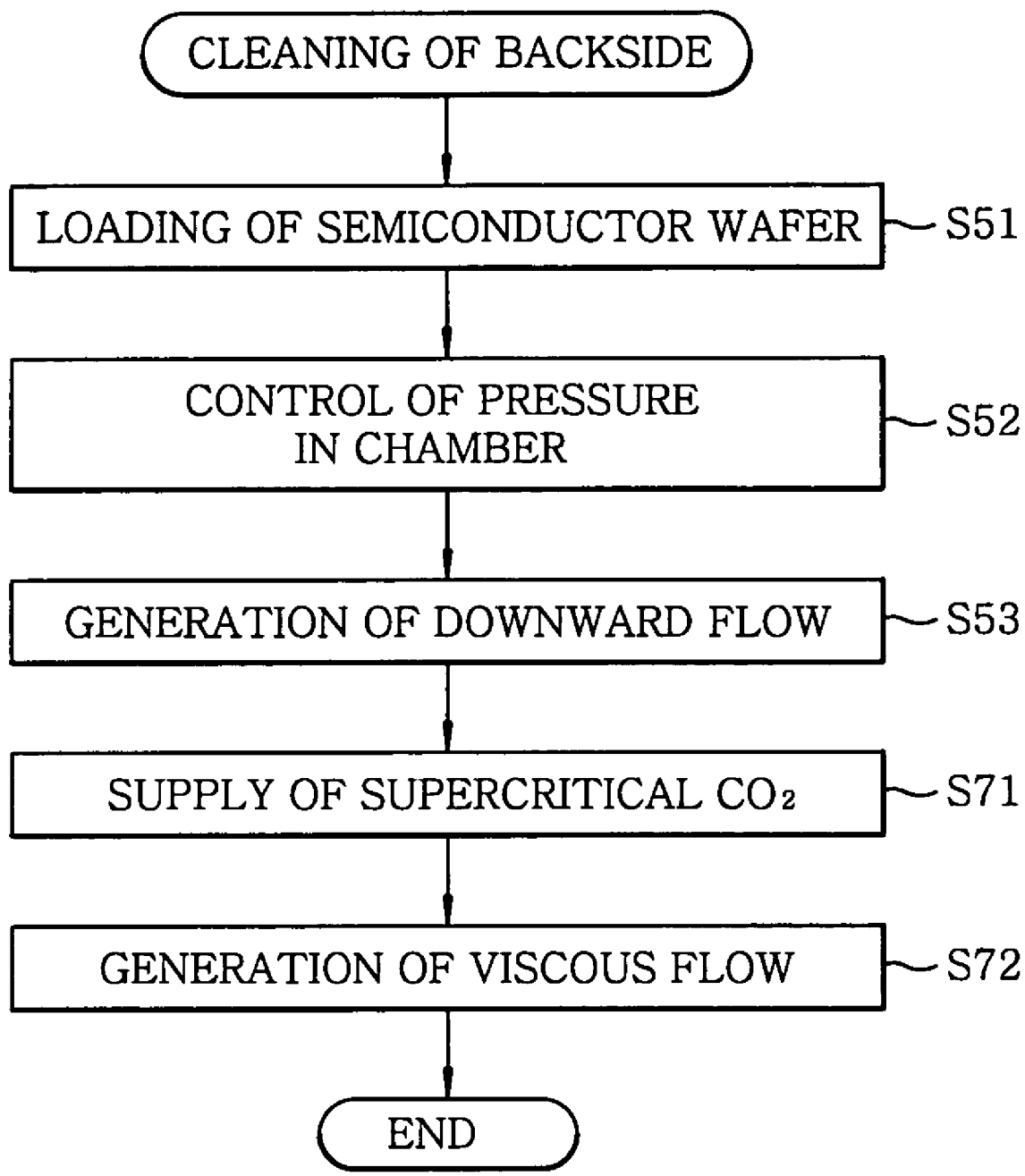
FIG. 7 offers a flow chart of a wafer backside cleaning processing as a substrate cleaning method in accordance with the second preferred embodiment.

FIG. 7 offers a flow chart of a wafer backside cleaning processing as a substrate cleaning method in accordance with the second preferred embodiment. Further, steps S51 to S53 in the processing of FIG. 7 are same as the steps S51 to S53 in the processing of FIG. 5.

Referring to FIG. 7, after a downward flow is generated in the main chamber 9 in the step S53, the upper processing fluid supply source 62 supplies a supercritical fluid formed of $CO_2$ toward an upper side above the wafer surface and the lower processing fluid supply source 63 supplies a supercritical fluid formed of $CO_2$ containing a compatible solvent and an additive toward a lower side below the wafer backside (step of contacting two phase substance) (step S71). At this time, the compatible solvent and the additive in the lower supercritical fluid completely surround and dissolve the particles P and the like on the wafer backside. The lower supercritical fluid carries the dissolved particles P and the like. Further, the DC power supplies 29 alternately apply voltages to the semiconductor wafer W; the ultrasonic vibrator 28 transmits ultrasonic vibrations to the semiconductor wafer W; and each of the heating lamps 24 increases a temperature of the semiconductor wafer W, thereby facilitating the detachment of the particles P and the like from the wafer backside.

The lower supercritical fluid flows along the wafer backside. At this time, due to a high pressure in the main chamber 9, the flow of the lower supercritical fluid forms a viscous flow (step of generating a flow near the wafer backside) (step S72). Further, the dissolved particles P and the like are carried and removed by the viscous flow from a vicinity of the wafer backside.

After a predetermined time period, e.g., 10 minutes, has elapsed from the beginning of the supercritical fluid supply, the supercritical fluid supply unit 61 stops the supercritical fluid supply and, then, the gas outlet 11 discharges the supercritical fluid in the main chamber 9. Thereafter, the supercritical fluid supply unit 61 supplies for five minutes a supercritical fluid formed of $CO_2$, which contains neither compatible solvent nor additive, from the upper and the lower processing fluid supply source 62 and 63, thereby cleaning the surface and the backside of the semiconductor wafer W. Then, the gas outlet 11 discharges the supercritical fluid used for the cleaning of the wafer W from the main chamber 9, and the processing is completed.

In accordance with the substrate cleaning apparatus and the substrate cleaning method in accordance with the second preferred embodiment, the lower supercritical fluid containing a compatible solvent and an additive contacts with the wafer backside and also forms a viscous flow near the wafer backside under a high pressure. The supercritical fluid has characteristics of two phases (gas phase and liquid phase), so that the particles P and the like adhered to the wafer backside can be efficiently removed by a synergy effect of such characteristics. To be specific, the compatible solvent and the additive in the lower supercritical fluid completely surround and dissolve the particles P and the like on the wafer backside. Further, the lower supercritical fluid carries the dissolved particles P and the like. Furthermore, by the viscous flow of the lower supercritical fluid, the dissolved particles P and the like are efficiently removed from the vicinity of the wafer backside. Accordingly, it is possible to completely remove the particles P and the like adhered to the wafer backside and to prevent a semiconductor device formed on the semiconductor wafer W from being deteriorated in quality.

In the aforementioned cleaning chamber 60, the supercritical fluid is supplied from the supercritical fluid supply unit 61. However, instead of the supercritical fluid supply unit 61, there may be provided a unit identical to the aerosol injection unit 23 in the cleaning chamber 5, so that the supercritical fluid containing a compatible solvent and an additive may be ejected toward the wafer backside. In this way, it is possible to increase the speed of the viscous flow generated near the wafer backside and to further efficiently remove the dissolved particles P and the like from the vicinity of the wafer backside.

Further, although the supercritical fluid containing a compatible solvent and an additive is supplied from the lower processing fluid supply source 63 in the cleaning chamber 60, there may be provided a separate supply source for supplying a compatible solvent and an additive toward a lower side below the wafer backside. In such case, when the wafer backside is cleaned, the lower processing fluid supply source 63 supplies a supercritical fluid containing neither a compatible solvent nor an additive into the main chamber 9 and, then, the separate supply source of a compatible solvent and an additive supplies the compatible solvent and the additive toward the lower side below the wafer backside. Consequently, it is possible to produce a supercritical fluid rich in compatible solvent and additive in the lower side below the wafer backside, thereby enabling to efficiently dissolve the particles P and the like on the wafer backside.

In the aforementioned cleaning chamber 60, it is preferable to shorten a distance between a sidewall of the main chamber 9 and a peripheral portion of the semiconductor wafer W supported by the grip arm unit 22. In this way, it is possible to reduce a conductance in a flow moving from the lower side below the semiconductor wafer W to the upper side above the semiconductor wafer W and further to prevent the lower supercritical fluid containing the dissolved particles P and the like from flowing upwardly onto the wafer surface.

In the aforementioned embodiments, the peripheral portion of the semiconductor wafer W is supported by the grip arm unit 22. However, the backside of the semiconductor wafer W may be supported by pusher pins or the like.

Hereinafter, a substrate cleaning apparatus in accordance with a third preferred embodiment of the present invention will be described.

A composition and an operation of the third preferred embodiment are basically same as those of the second preferred embodiment except that the wafer backside is cleaned by using an excimer laser as well as the aforementioned supercritical fluid. Therefore, redundant descriptions on the same composition and operation will be omitted, and only the differences in composition and operation will be described hereinafter.

FIG. 8 depicts a cross sectional view schematically illustrating a cleaning chamber serving as a substrate processing apparatus in accordance with the third preferred embodiment.

Referring to FIG. 8, a cleaning chamber 80 includes a main chamber 9, a gas inlet 10 and a gas outlet 11. The main chamber 9 has a grip arm unit 22, an excimer laser irradiating unit 81 for irradiating an excimer laser to be described later to a backside of a semiconductor wafer W supported by the grip arm unit 22, two heating lamps 24 and a heater (not shown) for heating the atmosphere in the main chamber 9.

The supercritical fluid supply unit 61 includes: a guide rail 82 disposed in parallel with the semiconductor wafer W supported by the grip arm unit 22; a laser base portion 83 moving along the guide rail 82; and an excimer laser oscillator 84 provided above the laser base portion 83, which directs toward the wafer backside.

The excimer laser, which is oscillated from the excimer laser oscillator 84 to be irradiated on the wafer backside, is a gas laser in which a transition between an excimer state and a ground state of atoms (molecules) of a rare gas or the like is applied to a laser oscillation, and has a short wavelength and a high output. As for such excimer laser, there has been known a rare gas halide excimer laser such as a KrF excimer laser. Since the excimer laser is of a high photon energy, it can easily heat an object to be irradiated by the laser with ease.

When the wafer backside is cleaned in the cleaning chamber 80, the wafer backside to which the excimer laser has been irradiated is expanded by a thermal energy and, then, the particles P and the like adhered to the wafer backside are detached and removed since the expansion rate of the wafer backside is different from those of the particles P.

Further, when the wafer backside needs to be cleaned, the laser base portion 83 moves along the guide rail 82. While the laser base portion 83 is moving, the excimer laser oscillator 84 irradiates an excimer laser toward the wafer backside. Accordingly, the excimer laser irradiating unit 81 can scan the entire backside of the wafer by using the excimer laser to thereby surely remove particles P and the like from the entire backside of the wafer.

While the wafer backside is cleaned in the cleaning chamber 80, the excimer laser irradiating unit 81 irradiates an excimer laser to remove the particles P and the like from the wafer backside. Besides, as in the substrate cleaning apparatus in accordance with the second preferred embodiment of the present invention, the supercritical fluid supply unit 61 supplies supercritical $CO_2$ from the upper processing fluid supply source 62 into the main chamber 9 toward an upper side above the wafer surface in a direction as indicated by the upper arrow in FIG. 8 and also supplies supercritical $CO_2$ containing a compatible solvent and an additive from the lower processing fluid supply source 63 toward a lower side below the wafer backside in a direction as indicated by the lower arrow in FIG. 8. Moreover, the ultrasonic vibrator 28 oscillates ultrasonic vibrations; the DC power supplies 29 alternately apply respective voltages to the semiconductor wafer W; and each of the heating lamps 24 increases a temperature of the semiconductor wafer W, thereby facilitating a dissolution and a removal of the particles P and the like from the wafer backside. Further, the gas outlet 11 generates a downward flow in the main chamber 9, which prevents the particles P and the like detached and dissolved in the lower supercritical fluid from flowing upwardly onto the wafer surface to be adhered thereto.

Hereinafter, a substrate cleaning method in accordance with the third preferred embodiment will be described.

FIG. 9 shows a flow chart of a wafer backside cleaning processing as a substrate cleaning method in accordance with the third preferred embodiment. Further, steps S51 to S53, S71 and S72 in the processing of FIG. 9 are same as the steps S51 to S53, S71 and S72 in the processing of FIG. 7.

Referring to FIG. 9, after the downward flow is generated in the main chamber 9 in the step S53, the excimer laser oscillator 84 irradiates an excimer laser toward the wafer backside (step of irradiating high-energy light) (step S91). The wafer backside to which the excimer laser has been irradiated is expanded by a thermal energy, so that the particles P and the like adhered thereto are detached.

Next, the upper processing fluid supply source 62 supplies supercritical fluid formed of $CO_2$ toward the upper side above the wafer surface, and the lower processing fluid supply source 63 supplies supercritical fluid formed of $CO_2$ containing a compatible solvent and an additive toward the lower side below the wafer backside (step S71). Further, the DC power supplies 29 alternately apply respective voltages to the semiconductor wafer W; the ultrasonic vibrator 28 transmits ultrasonic vibrations to the semiconductor wafer W; and each of the heating lamps 24 increases a temperature of the semiconductor wafer W, thereby facilitating the detachment of the particles P and the like therefrom.

The lower supercritical fluid flows along the wafer backside and the flow of the lower supercritical fluid forms a viscous flow due to a high pressure in the main chamber 9 (step of generating a flow near the wafer backside) (step S72). Further, the dissolved particles P and the like are carried and removed by the viscous flow from the vicinity of the wafer backside. After a predetermined time has elapsed from the beginning of the supercritical fluid supply, the processing is completed.

In accordance with the substrate cleaning apparatus and the substrate cleaning method in accordance with the third preferred embodiment, the excimer laser is irradiated on the wafer backside and, further, the lower supercritical fluid forms a viscous flow near the wafer backside under a high pressure condition. The wafer backside to which the excimer laser has been irradiated is expanded by a thermal energy. Due to a difference between the expansion rate of the wafer backside and those of the particles P, the particles P and the like adhered to the wafer backside are detached therefrom. The viscous flow formed by the lower supercritical fluid efficiently removes the detached particles P and the like from the vicinity of the wafer backside. Accordingly, it is possible to completely remove the particles P and the like adhered to the wafer backside, thereby preventing quality deterioration of a semiconductor device formed on the semiconductor wafer.

In the aforementioned cleaning chamber 80, the excimer laser is irradiated on the wafer backside by the excimer laser irradiating unit 81. However, instead of the excimer laser irradiating unit 81, there may be provided an excimer lamp for widely irradiating an excimer laser to irradiate an excimer laser on the wafer backside. Since the excimer lamp can irradiate the excimer laser toward the entire backside of the wafer, the particles P and the like can be efficiently removed from the wafer backside.

Further, in the cleaning chamber 80, the aerosol injection unit 23 may be provided instead of the supercritical fluid supply unit 61.

The object of the present invention can also be achieved by supplying a storage medium for storing therein software program codes for executing functions of the aforementioned embodiments to a personal computer of the substrate processing system 1 (hereinafter, referred to as "PC") or to an external server, e.g., an advanced process control (APC) server, and then reading the program codes stored in the storage medium with the help of a CPU of the PC or the APC server.

In this case, it is considered that the functions of the aforementioned embodiments are implemented by the program codes read from the storage medium and, thus, the storage medium for storing therein the program codes is included in the present invention.

As for the storage medium for supplying the program codes, there can be used a Floppy (registered mark) disc, a hard disc, a magneto-optical disc, a CD-ROM, a CD-R, a CD-RW, a DVD-ROM, a DVD-RAM, a DVD-RW, a DVD+RW, a magnetic tape, a nonvolatile memory card, a ROM or the like. Alternatively, the program codes may be downloaded through a network. In this case, the program codes are supplied through a download from database or another computer (not shown) connected to the Internet, a commercial network, a local area network or the like.

Further, the functions of the aforementioned embodiments are achieved not only by executing the program codes read by the CPU but also by implementing a partial or an entire actual processing based on instructions of the program codes with the help of an operating system (OS) or the like working in the CPU board.

In addition, the functions of the aforementioned embodiments can be implemented by recording the program codes read from the storage medium in a memory having a function extension board inserted in the PC or the APC server or a function extension unit connected to the PC or the ACP server and then performing a partial or an entire actual processing with the help of the CPU or the like provided in the function extension board or in the function extension unit.

The program codes may include object codes, program codes implemented by an interpreter, script data supplied to the OS or the like.

In the cleaning chamber serving as the substrate cleaning apparatus in accordance with each of the aforementioned embodiments, a cleaning process is performed on the backside of the wafer which has undergone an etching process. However, before the etching process is carried out, the wafer backside may be cleaned as a pre-treatment. Further, the wafer backside cleaning process can be performed between multiple plasma processes as an intermediate treatment.

Although the cleaning chamber has been described as a component of the cluster substrate processing system 1 in the aforementioned embodiments, it may be a component of a parallel substrate processing system. Alternatively, the cleaning chamber may be provided as a separate device without being included in the substrate processing system 1.

When the wafer backside needs to be cleaned in the aforementioned cleaning chamber, the semiconductor wafer W is heated by the heating lamps 24. However, there may be provided a heater, instead of the heating lamps 24 disposed in the main chamber 9. Accordingly, the semiconductor wafer W may be heated by heat rays irradiated from the heater.

In each of the aforementioned embodiments, an etching process is performed on the semiconductor wafer W in the vacuum chambers 4a to 4e. However, other plasma processes such as a coating and developing treatment, a substrate cleaning process, a heat treatment and the like may also be performed on the semiconductor wafer W in the vacuum chamber 4a to 4e.

Although a substrate to be processed is a semiconductor wafer in the aforementioned embodiments, it may be a glass substrate, e.g., a liquid crystal display (LCD), a flat panel display (FPD) or the like.

While the invention has been shown and described with respect to the preferred embodiments, it will be understood by those skilled in the art that various changes and modification may be made without departing from the spirit and scope of the invention as defined in the following claims.

What is claimed is:

1. A substrate cleaning method for cleaning a backside of a substrate on a front surface of which a predetermined processing is performed, the method comprising:
    contacting a two phase substance to the backside of the substrate; and
    generating a flow of the substance near the backside of the substrate under a specified pressure,
    wherein the method further to facilitate removal of particles from the backside of the surface comprises:
    generating ultrasonic vibrations and transmitting the ultrasonic vibrations to the substrate,
    applying DC voltages to the substrate to generate electromagnetic stress acting on the backside of the substrate, and
    irradiating heat rays on the front surface of the substrate to generate a thermophoretic force,
    wherein all of said generating the ultrasonic vibrations, said applying the DC voltages and said irradiating the heat rays are carried out concurrently with said contacting.

2. The method of claim 1, wherein the two phase substance is a gas containing aerosol.

3. The method of claim 1, wherein the specified pressure is higher than or equal to 133 Pa (1 Torr).

4. The method of claim 1, wherein the two phase substance is a supercritical substance.

5. The method of claim 4, wherein the supercritical substance contains an additive for dissolving deposits adhered to the substrate.

6. The method of claim 5, wherein in the step of contacting the two phase substance to the backside of the substrate, a supercritical substance without containing the additive is made to contact the surface of the substrate and the supercritical substance containing the additive is made to contact the backside of the substrate.

7. A substrate cleaning method for cleaning a backside of a substrate on a front surface of which a predetermined processing is performed, the method comprising:
    irradiating a high-energy light on the backside of the substrate; and generating a flow of a substance near the backside of the substrate under a specified pressure,
    wherein the method further to facilitate removal of particles from the backside of the surface comprises:
    generating ultrasonic vibrations and transmitting the ultrasonic vibrations to the substrate,
    applying DC voltages to the substrate to generate electromagnetic stress acting on the backside of the substrate, and
    irradiating heat rays on the front surface of the substrate to generate a thermophoretic force,
    wherein all of said generating the ultrasonic vibrations, said applying the DC voltages and said irradiating the heat rays are carried out concurrently with said irradiating the high-energy light.

8. The method of claim 7, wherein the substance is a two phase substance.

9. The method of claim 8, wherein the two phase substance is a gas containing aerosol.

10. The method of claim 8, wherein the two phase substance is a supercritical substance.

* * * * *